US010757842B2

(12) United States Patent
Takeuchi

(10) Patent No.: US 10,757,842 B2
(45) Date of Patent: Aug. 25, 2020

(54) ELECTRICAL POWER CONVERSION APPARATUS

(71) Applicant: DENSO CORPORATION, Kariya, Aichi-pref. (JP)

(72) Inventor: Kazuya Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/975,826

(22) Filed: May 10, 2018

(65) Prior Publication Data

US 2018/0332739 A1 Nov. 15, 2018

(30) Foreign Application Priority Data

May 10, 2017 (JP) .................................. 2017-094101

(51) Int. Cl.
| | |
|---|---|
| *H05K 7/20* | (2006.01) |
| *H05K 1/02* | (2006.01) |
| *H02M 7/00* | (2006.01) |
| *H02M 7/537* | (2006.01) |
| *H01L 23/473* | (2006.01) |
| *H01L 23/40* | (2006.01) |

(52) U.S. Cl.
CPC ..... *H05K 7/20927* (2013.01); *H01L 23/4012* (2013.01); *H01L 23/473* (2013.01); *H02M 7/003* (2013.01); *H02M 7/537* (2013.01); *H05K 1/0203* (2013.01); *H01L 23/40* (2013.01); *H01L 2224/33* (2013.01)

(58) Field of Classification Search
CPC ....... H05K 7/20927–7/20936; H05K 7/20218; H05K 7/20263; H05K 7/1432; H05K 7/2039; H05K 7/20445; H01L 23/473

USPC .......................... 361/699, 701–702; 363/141; 165/80.4–80.5, 104.33; 257/712–714; 174/547–548

See application file for complete search history.

(56) References Cited

U.S. PATENT DOCUMENTS

| 7,245,493 B2 * | 7/2007 | Inagaki ............... H01L 23/4334 174/15.1 |
| 7,571,759 B2 * | 8/2009 | Inagaki ................. F28D 1/0325 165/166 |

(Continued)

FOREIGN PATENT DOCUMENTS

| JP | 2007-173372 A | 7/2007 |
| JP | 2014-087209 A | 5/2014 |

*Primary Examiner* — Daniel P Wicklund
*Assistant Examiner* — Amir A Jalali
(74) *Attorney, Agent, or Firm* — Oliff PLC

(57) ABSTRACT

An electrical power conversion apparatus is provided which includes a semiconductor module and a plurality of cooling pipes. Each of the cooling pipes has an electrical conductivity and a cooling medium flow path formed therein. Each of the cooling pipes is equipped with a flow path extension forming portion which protrudes above a module body in at least one of height-wise directions and in which a portion of the cooling medium flow path is formed. The flow path extension forming portion overlaps at least either of the power terminals or the control terminals in a stacking direction of the cooling pipes. This enhances the efficiency in decreasing the inductance of the power terminals and/or the control terminals, improves the productivity of the electrical power conversion apparatus, and enables the size of the electrical power conversion apparatus to be reduced.

9 Claims, 15 Drawing Sheets

(56) References Cited

U.S. PATENT DOCUMENTS

| | | | | |
|---|---|---|---|---|
| 7,965,508 B2* | 6/2011 | Yamamoto | ............ | H01L 23/473 |
| | | | | 174/15.1 |
| 8,151,868 B2* | 4/2012 | Inagaki | ................ | F28D 1/0333 |
| | | | | 165/153 |
| 8,717,760 B2* | 5/2014 | Iguchi | ................ | H05K 7/20927 |
| | | | | 165/80.4 |
| 8,879,256 B2* | 11/2014 | Ichijyo | ............... | H05K 7/20927 |
| | | | | 165/104.33 |
| 9,190,933 B2* | 11/2015 | Yamaura | ............... | H02M 7/003 |
| 9,818,673 B2* | 11/2017 | Mizuno | ............. | H05K 7/20927 |
| 9,881,852 B2* | 1/2018 | Kimura | ................ | H01L 23/3114 |
| 10,076,068 B2* | 9/2018 | Ohoka | ................ | H05K 7/1432 |
| 2015/0195957 A1* | 7/2015 | Ohoka | ............... | H05K 7/20927 |
| | | | | 361/702 |
| 2016/0309614 A1* | 10/2016 | Kikuchi | ............... | H05K 7/2089 |

* cited by examiner

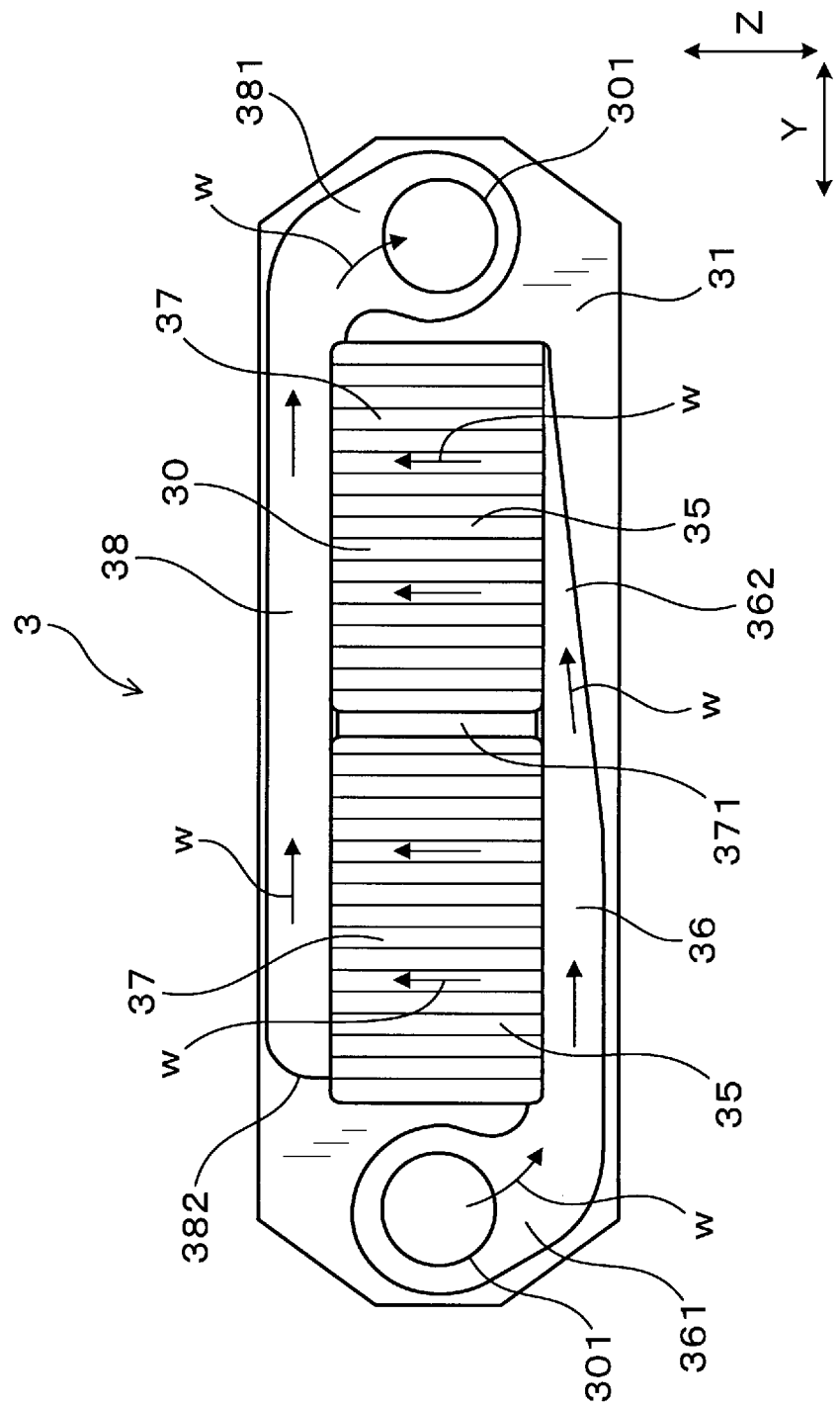

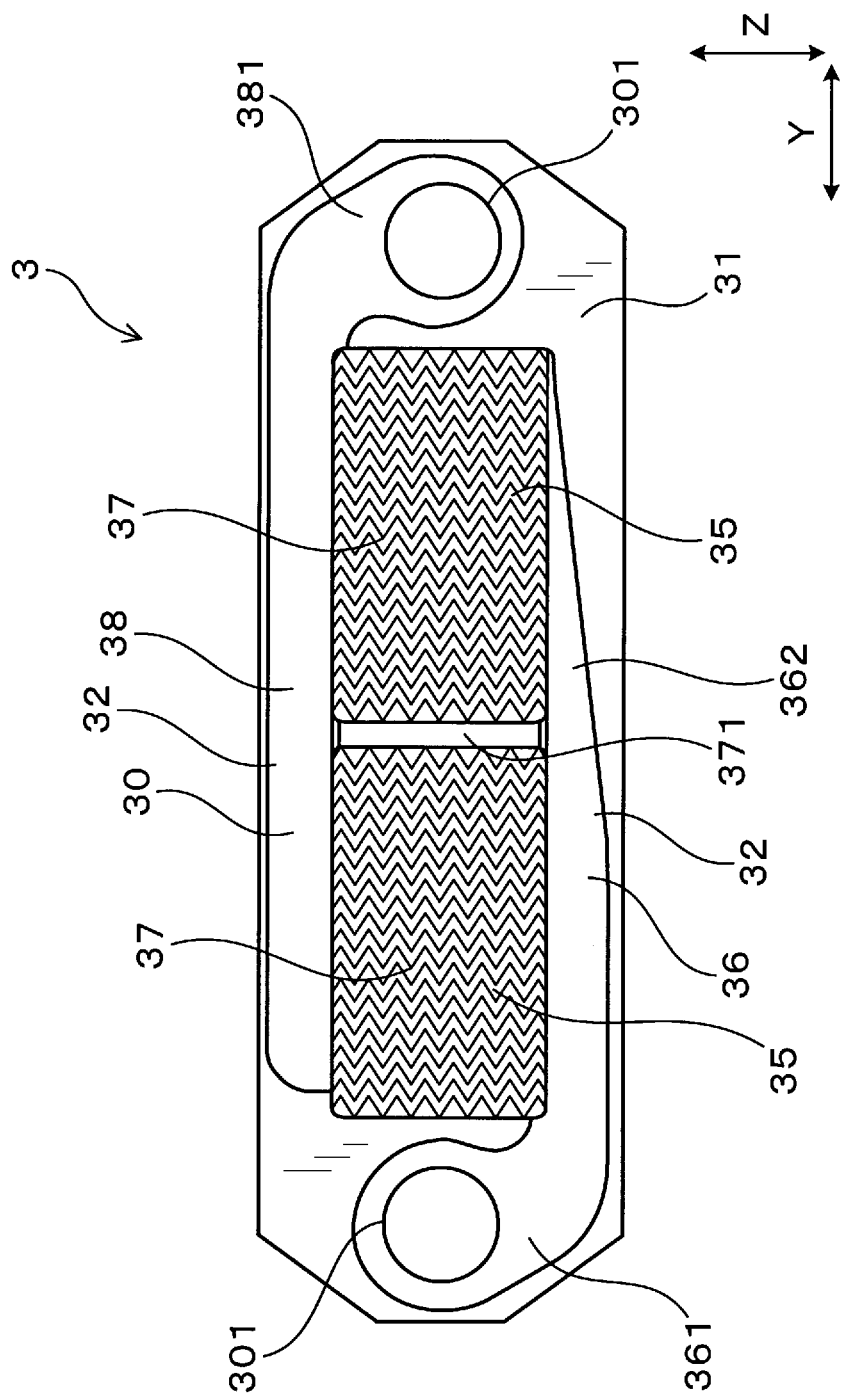

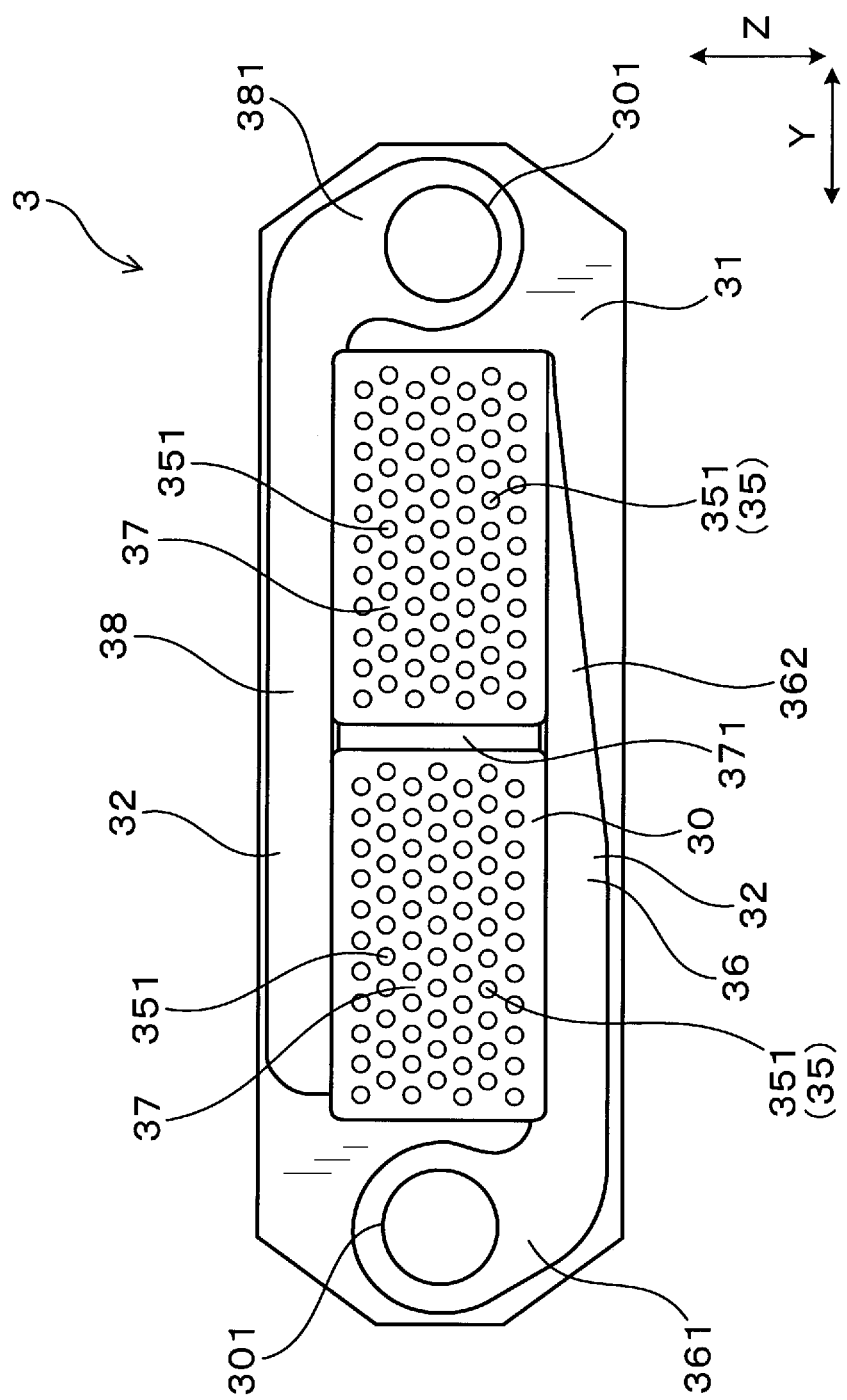

ELECTRICAL POWER CONVERSION APPARATUS

CROSS REFERENCE TO RELATED DOCUMENT

The present application claims the benefit of priority of Japanese Patent Application No. 2017-94101 filed on May 10, 2017, the disclosure of which is incorporated herein by reference.

BACKGROUND

1 Technical Field

This disclosure relates generally to an electrical power conversion apparatus equipped with semiconductor modules and cooling pipes.

2 Background Art

Typically, electrical power conversion devices, such as inverters or converters, are equipped with semiconductor modules in which semiconductor devices are installed. The semiconductor modules are usually designed to have a plurality of power terminals and a plurality of control terminals extending outside a module body. The power terminals are connected to a bus bar. The control terminals are connected to a control circuit board. These arrangements form an electric current loop including the power terminals and an electric current loop including the control terminals.

The current loop has a parasitic inductance. It is, therefore, desirable to reduce the inductance of the power terminals or the control terminals in order to decrease switching surge or switching loss in the semiconductor module.

Japanese Patent First Publication No. 2007-173372 discloses an electrical power conversion device which is equipped with semiconductor modules and cooling pipes working to cool the semiconductor modules. Each of the cooling pipes has an intermediate plate extending outside the cooling pipe in order to enhance efficiency in reducing a rise in temperature in the electrical power conversion device. Specifically, each of the cooling pipes has a pair of outer shell plates and an intermediate plate disposed between the outer shell plates. The intermediate plate extends outside the outer shell plates.

The above electrical power conversion device still has room for improvement as discussed below.

The intermediate plate has a portion which protrudes outside the outer shell plates and overlaps the power terminals or the control terminals in a direction in which the semiconductor modules are stacked (which will also be referred to below as a stacking direction). The protrusion of the intermediate plate serves to reduce the inductance of the power terminals or the control terminals as well as to minimize a rise in temperature in the electrical power conversion device. Specifically, a current loop through which an electrical current flows through the power terminals creates a magnetic flux which passes through the protrusion and changes with time, thereby developing an eddy current flowing in the protrusion. The eddy current is directed to cancel the magnetic flux, thereby reducing the inductance of the power terminals. The same beneficial advantage is also offered in a case where the protrusion is laid to face the control terminals.

The protrusion is, however, formed by a portion of the intermediate plate, thus resulting in a difficulty in placing the protrusion closer to the power terminals or the control terminals, which may lead to insufficient reduction in the inductance.

Most of the intermediate plate is disposed inside the cooling pipe. The intermediate plate is, thus, usually made of a thin plate, which may result in a lack in mechanical strength of the protrusion of the intermediate plate. There is, therefore, a risk that the protrusion is undesirably deformed when the electrical power conversion device is produced or maintained, which adversely impinges on the production of the electrical power conversion device. There is, therefore, still room for improvement of the productivity of the electrical power conversion device.

SUMMARY

It is therefore an object of this disclosure to provide an electrical power conversion apparatus which is designed to enhance a reduction in the inductance, improve productivity thereof, and enables to be reduced in size thereof.

According to one aspect of this disclosure, there is provided an electrical power conversion apparatus which comprises: (a) a semiconductor module which includes a module body in which a semiconductor device is installed, a plurality of power terminals extending from the module body, and a plurality of control terminals extending from the module body, the module body having major surfaces; and (b) a first and a second cooling pipe which are stacked on each other on opposite sides of the semiconductor module and hold the major surfaces of the module body therebetween.

Each of the first and second cooling pipes has electrical conductivity and is equipped with a cooling medium flow path in which a cooling medium flows.

The power terminals extend from the module body in a first height-wise direction that is one of height-wise directions perpendicular to a stacking direction in which the first and second cooling pipes and the semiconductor module are stacked.

The control terminals extend from the module body in a second height-wise direction that is one of the height-wise directions.

Each of the first and second cooling pipes includes a flow path extension forming portion which extends therefrom over the module body in at least one of the height-wise directions and in which a portion of the cooling medium flow path is formed.

The flow path extension forming portions overlap at least either of the power terminals or the control terminals in the stacking direction.

The electrical power conversion apparatus includes the first and second cooling pipes each of which is equipped with the flow path extension forming portion. The flow path extension forming portion is arranged to overlap either of the power terminals or the control terminals in the stacking direction. When current flows through the power terminals or the control terminals, it causes an eddy current to be created in the flow path extension forming portion, thereby canceling magnetic fluxes developed by a current loop. This decreases the inductance of the power terminals.

The flow path extension forming portions has the cooling medium flow path formed therein. This enables the flow path extension forming portion be located closer to the power terminals or the control terminals in the stacking direction. This results in a great reduction in inductance of the power terminals or the control terminals. The arrangement of the flow path extension forming portion close to the power terminals or the control terminals facilitates cooling of the power terminals or the control terminals.

The flow path extension forming portion is designed to have the cooling medium flow path formed therein, so that it is made of a relatively thick material, thereby ensuring a desired mechanical strength of the flow path extension forming portion. This minimizes a risk of undesirable deformation of the flow path extension forming portion, which improves the productivity of the electrical power conversion apparatus.

As apparent from the above discussion, the electrical power conversion apparatus is designed to decrease the inductance of the power terminals and/or the control terminals, improve the productivity thereof, and enable the size thereof to be reduced.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings:

FIG. 13 is an explanatory view which illustrates a flow path of a cooling medium in a cooling pipe in the third embodiment;

FIG. 14 is an explanatory view which illustrates a flow path of a cooling medium in a cooling pipe in the fourth embodiment; and FIG. 15 is an explanatory view which illustrates a flow path of a cooling medium in a cooling pipe in the fifth embodiment.

DESCRIPTION OF THE PREFERRED EMBODIMENTS

First Embodiment

Figure 1:
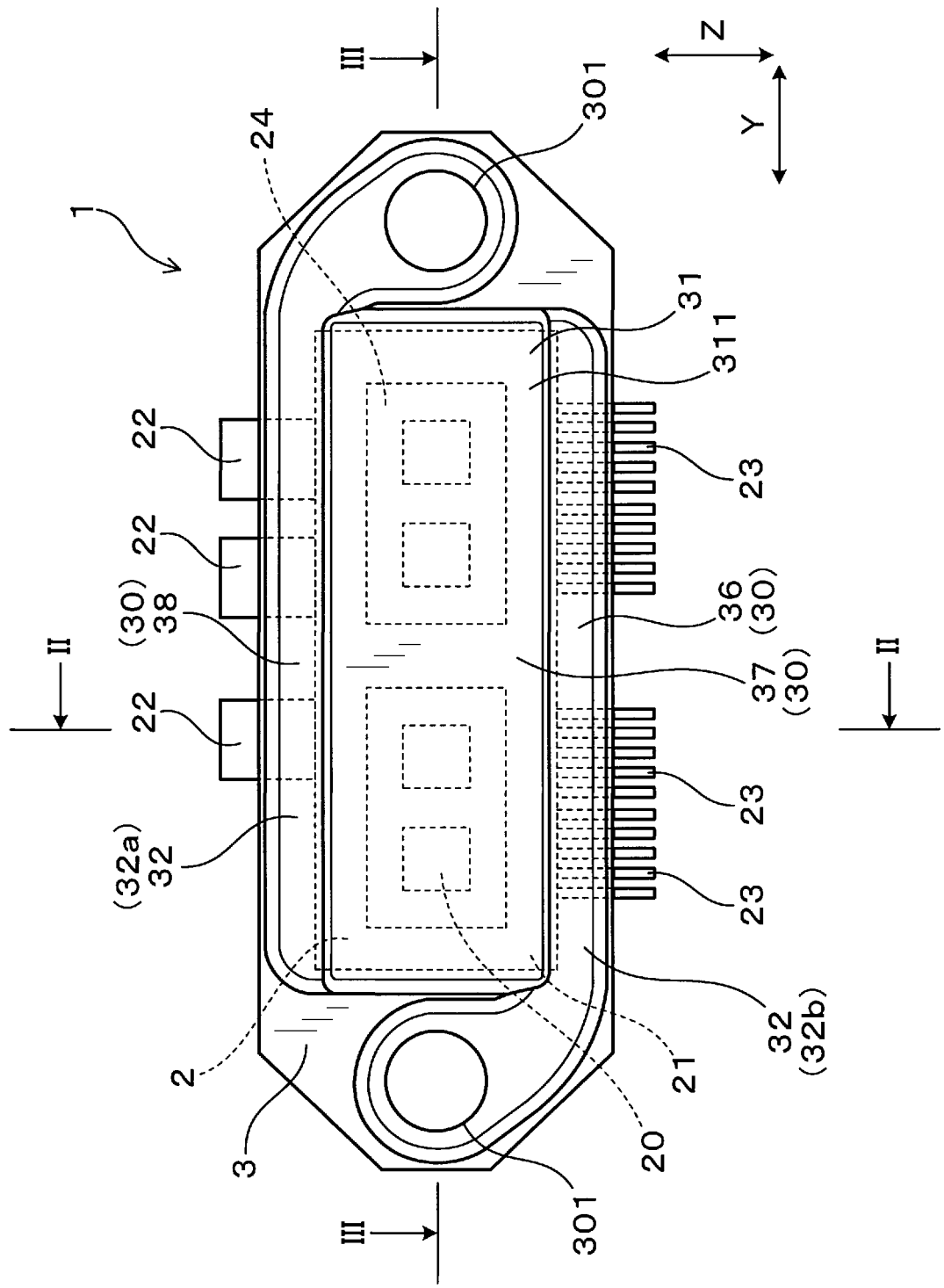
FIG. 1 is a front view which illustrates a semiconductor module and a cooling pipe according to the first embodiment.
Figure 2:
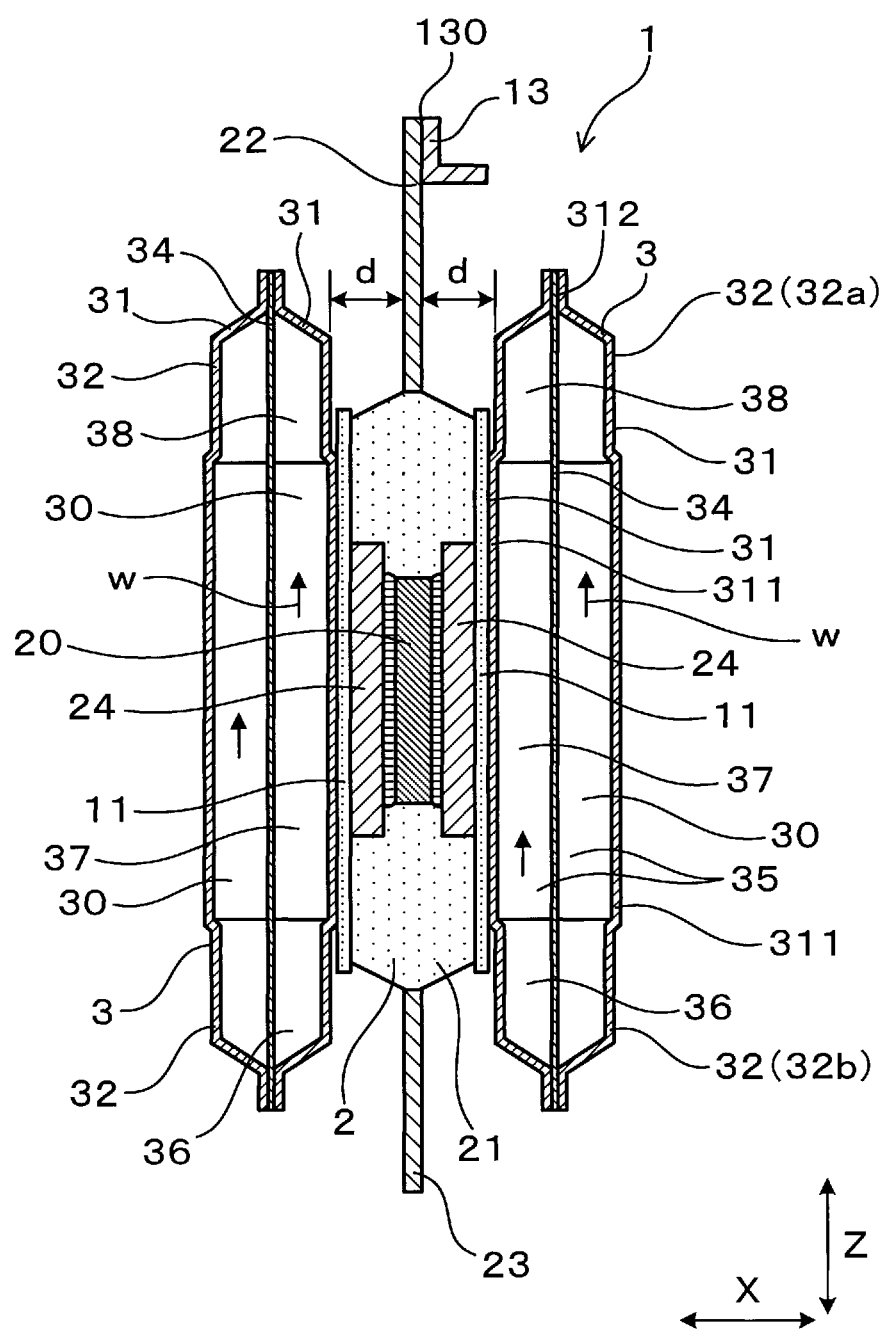
FIG. 2 is a sectional view, as taken along the line II-II in FIG. 1, which illustrates a portion of an electrical power conversion device according to the first embodiment.
Figure 3:
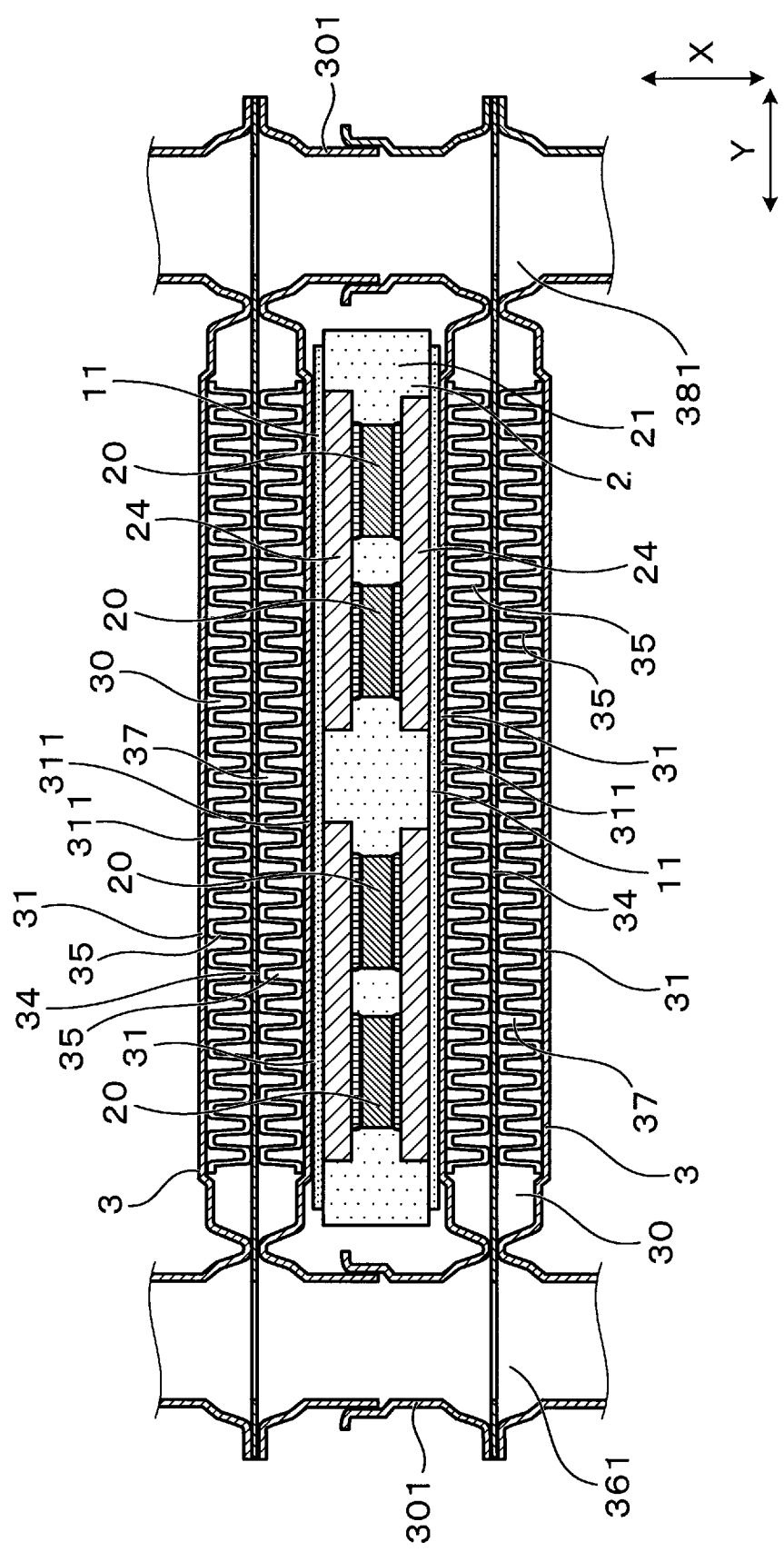
FIG. 3 is a sectional view, as taken along the line III-III in FIG. 1, which illustrates a portion of an electrical power conversion device according to the first embodiment.

Referring now to the drawings, wherein like reference numbers will refer to like parts throughout the several views, particularly to FIGS. 1 to 9, there is shown the electrical power conversion device 1 according to the first embodiment. The electrical power conversion device 1 is, as illustrated in FIGS. 1 to 3, equipped with the semiconductor modules 2 and a plurality of cooling pipes (i.e., cooling tubes) 3 which are stacked to hold major opposed surfaces of each of the semiconductor modules 2 therebetween.

Each of the semiconductor module 2 is equipped with the module body 21 in which the semiconductor device 20 is installed, a plurality of power terminals 22 protruding from the module body 21, and a plurality of control terminals 23 protruding from the module body 21.

Each of the cooling pipes 3 has electrical conductivity and is equipped with the cooling medium flow path 30 which is designed to have a cooling medium flowing therethrough.

The power terminals 22 extend from the module body 21 in the same one of height-wise directions Z of the electrical power conversion device 1. The control terminals 23 extend from the module body 21 in the same one of the height-wise directions Z.

The height-wise directions Z are directions perpendicular to a stacking direction X that is a direction in which the cooling pipes 3 and the semiconductor module 2 are stacked. The height-wise directions Z are oriented parallel to directions in which the power terminals 22 and the control terminals 23 protrude from the module body 21 (i.e., a lengthwise direction of the power terminals 22 and the control terminals 23). A direction perpendicular both to the stacking direction X and the height-wise directions Z will also be referred to as a lateral direction Y. The lateral direction Y and the height-wise directions Z are defined for convenience sake and do not specify orientation of the electrical power conversion device 1. The orientation of the electrical power conversion device 1 may be changed depending upon the type of usage thereof.

Each of the cooling pipes 3 is, as illustrated in FIGS. 1 and 2, equipped with the flow path extension forming portions 32. The flow path extension forming portions 32 protrude from the module body 21 in at least one of the height-wise directions Z and define portions of the cooling medium flow path 30 therein.

Each of the flow path extension forming portions 32 overlap the power terminals 22 and the control terminals 23 in the stacking direction X.

Each of the semiconductor modules 2 is designed to have the power terminals 22 extending from a main body thereof in one of the height-wise directions Z and the control terminals 23 extending from the main body in a direction opposite the direction in which the power terminals 22 extend. Each of the cooling pipes 3 has the flow path extension forming portions 32 protruding both in the height-wise directions Z. Specifically, the flow path extension forming portions 32 of each of the cooling pipes 3, as clearly illustrated in FIGS. 1 and 2, include the flow path extension forming portion 32a (which will also be referred to below as a first flow path extension forming portion) extending in the same direction as the power terminals 22 and the flow path extension forming portion 32b (which will also be referred to below as a second flow path extension forming portion) extending in the same direction as the control terminals 23. The flow path extension forming portion 32a overlaps the power terminals 22 in the stacking direction X. The flow path extension forming portion 32b overlaps the control terminals 23 in the stacking direction X.

In this disclosure, the direction in which the power terminals 22 extend from the module body 21 of each of the semiconductor modules 2 in one of the height-wise directions Z is also referred to as an upper side or upward direction, while a direction opposite to such a direction is also referred to as a lower side or downward direction. These directions are, however, used only for the sake of convenience regardless of orientation of the electrical power conversion device 1 when actually used.

Figure 4:
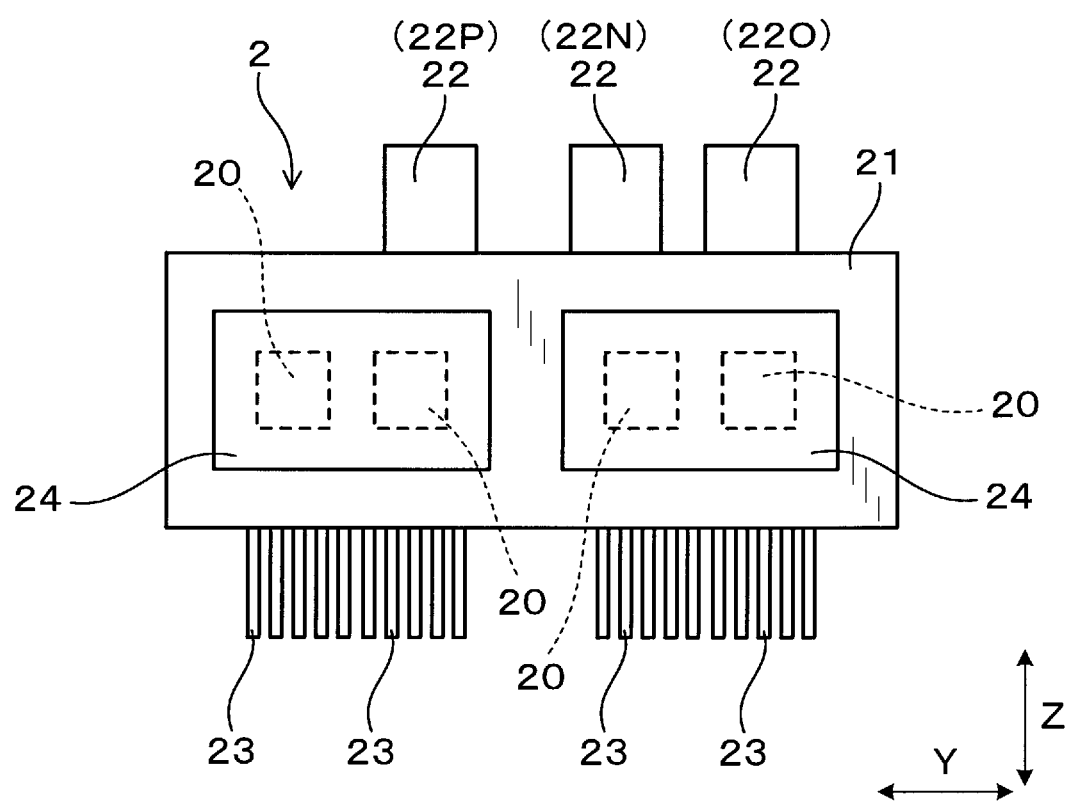
FIG. 4 is a front view which illustrates a semiconductor module in the first embodiment.
Figure 5:
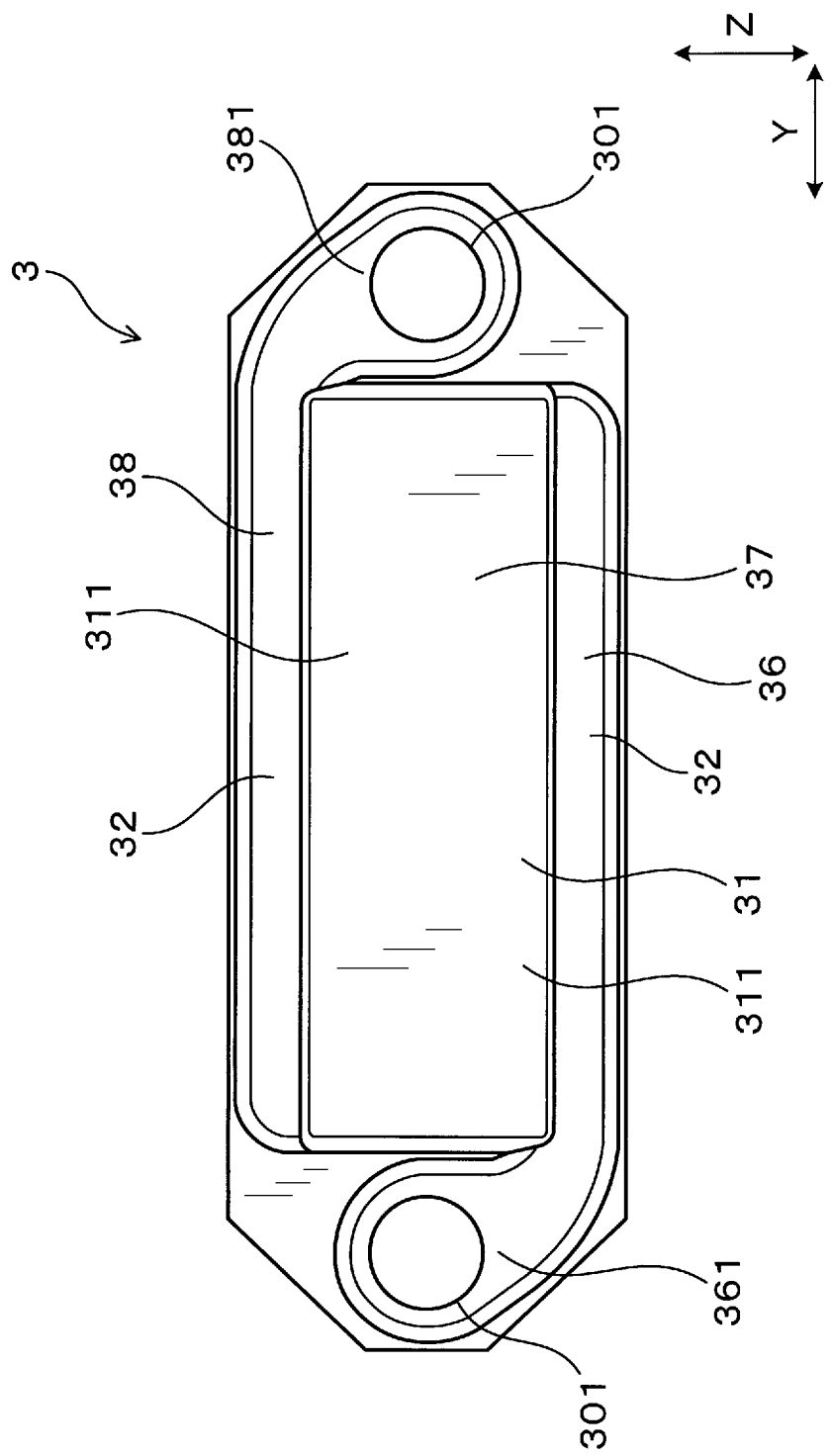
FIG. 5 is a front view which illustrates a cooling pipe in the first embodiment.

The power terminals 22 of each of the semiconductor modules 2 are, as clearly illustrated in FIGS. 1 and 4, aligned in the lateral direction Y. Similarly, the control terminals 23 of each of the semiconductor modules 2 are aligned in the lateral direction Y.

The adjacent power terminals 22 are arranged away from each other in the lateral direction Y. In other words, there is a void space or region between each two adjacent power terminals 22 in the lateral direction Y. The flow path extension forming portion 32a faces the void regions in the stacking direction X. In other words, each of the flow path extension forming portions 32a extends continuously in the lateral direction Y and overlaps all the power terminals 22 which are spaced apart from each other in alignment in the lateral direction Y.

Similarly, each of the flow path extension forming portions 32b extends continuously in the lateral direction Y and overlaps all the control terminals 23 which are spaced apart from each other in alignment in the lateral direction Y.

Figure 6:
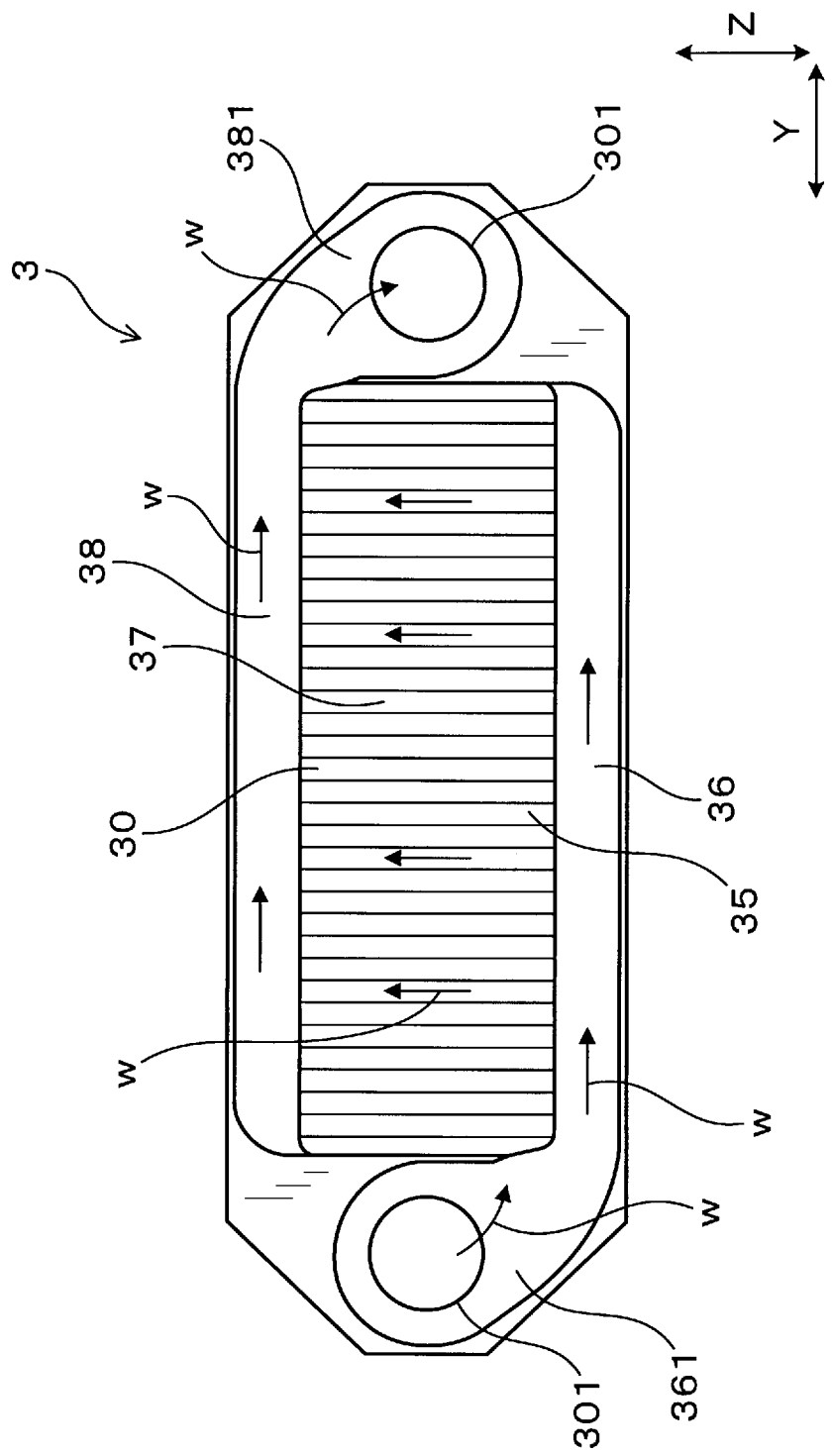
FIG. 6 is an explanatory view which illustrates a flow path of a cooling medium in a cooling pipe in the first embodiment.

Each of the cooling pipes 3 is, as illustrated in FIGS. 2 and 6, equipped with the heat exchanger 37, the cooling medium supply path 36, and the cooling medium draining path 38 which define the cooling medium flow path 30. The cooling medium supply path 36 and the cooling medium draining path 38 are located on sides of the heat exchanger 37 which are opposed to each other in the height-wise direction Z. The heat exchanger 37 works to exchange heat between the cooling medium and the module body 21. The cooling medium supply path 36 and the cooling medium draining path 38 are each formed in the flow path extension forming portions 32. The heat exchanger 37 is designed to create a flow of the cooling medium w from the cooling medium supply path 36 to the cooling medium draining path 38 in the height-wise direction Z.

The cooling medium supply path 36 overlaps the control terminals 23 in the stacking direction X. The cooling medium draining path 38 overlaps the power terminals 22 in the stacking direction X. Specifically, the cooling medium supply path 36 has a first portion and a second portion adjacent in the height-wise direction Z. The first portion overlaps the control terminals 23 in the stacking direction X, while the second portion overlaps the module body 21 in the stacking direction X. In other words, a portion of the cooling medium supply path 36 is formed in the flow path extension forming portion 32b. The whole of the cooling medium supply path 36 may alternatively be formed in the flow path extension forming portion 32b.

Similarly, the cooling medium draining path 38 has a first portion and a second portion adjacent in the height-wise direction Z. The first portion overlaps the power terminals 22 in the stacking direction X, while the second portion overlaps the module body 21 in the stacking direction X. In other words, a portion of the cooling medium draining path 38 is formed in the flow path extension forming portion 32a. The whole of the cooling medium draining path 38 may alternatively be formed in the flow path extension forming portion 32a.

Each of the cooling pipes 3 is, as illustrated in FIGS. 2 and 3, equipped with a pair of outer shell plates 31 and the intermediate plate 34 which is disposed between the outer shell plates 31. The intermediate plate 34 is firmly held at the flow-path outer peripheries 312 thereof between the pair of the outer shell plates 31.

The intermediate plate 34 is made of a flat plate with two opposed major surfaces. The intermediate plate 34 is sandwiched at the major surfaces thereof by the outer shell plate 31 and welded together. The intermediate plate 34 and each of the outer shell plates 31 define the cooling medium flow path 30 therebetween. The corrugated inner fins 35 are disposed between the intermediate plate 34 and the respective outer shell plates 31.

The inner fins 35 are, as illustrated in FIG. 6, disposed in the heat exchanger 37 in the cooling medium flow path 30. The inner fins 35 are formed by a corrugated metallic plate which has a wavy section perpendicular to the height-wise direction Z. Spaces which extend in the height-wise direction Z between the inner fins 35 and the outer shell plates 31 and between the inner fins 35 and the intermediate plate 34 define a portion of the cooling medium flow path 30. The spaces extent straight in the height-wise direction Z.

The outer shell plates 31, the intermediate plate 34, and the inner fins 35 are each made of a metallic plate such as an aluminum alloy plate. The intermediate plate 34 is smaller in thickness than the outer shell plates 31. For example, the thickness of the intermediate plate 34 may be selected to be less than or equal to half the thickness of the outer shell plate 31. The thickness of the inner fins 35 is also smaller than or equal to that of the outer shell plates 31. The thickness of the inner fins 35 may be selected to be less than or equal to that of the intermediate plate 34. The outer shell plates 31, the intermediate plate 34, and the inner fins 35 are jointed together by brazing or welding.

The cooling medium flow path 30 is designed to have a cooling medium, such as water, flowing therethrough. The cooling medium may alternatively be a natural cooling medium, such as ammonia, water with which ethylene glycol antifreezing fluid is mixed, fluorocarbon cooling medium, such as Fluorinert, fluorocarbon cooling medium, such as HCFC-123 or HFC-134a, alcohol cooling medium, such as methanol or alcohol, or ketone-based cooling medium, such as acetone.

The insulator 11 is, as clearly illustrated in FIGS. 2 and 3, disposed between each of the cooling pipes 3 and the semiconductor module 2. The insulator 11 is made of a ceramic plate which has a higher thermal conductivity. The insulator 11 and the cooling pipes are stacked on each of opposed major surfaces of the semiconductor module 2 (i.e., opposed major surfaces of the module body 21). In other words, the two adjacent cooling pipes 3 (which will also be referred to below as a first and a second cooling pipe) hold the major surfaces of the module body 21 of each of the semiconductor modules 2 therebetween through the insulators 11. The semiconductor module 2 has heat radiating plates 24 exposed to the major surfaces thereof. The insulators 11 are mounted through grease, not shown, in contact with the major surfaces of the semiconductor module 2 to which the heat radiating plates 24 are exposed. The cooling pipe 3 is arranged in contact with each of the insulators 11 through grease, not shown.

Each of the cooling pipes 3 has the raised portions 311 each of which bulges toward the insulator 11 and is placed in contact with the insulator 11. When viewed in the stacking direction X, the raised portions 311 is located inside the outlines of the major surfaces of the module body 21 of the semiconductor module 2. When viewed in the stacking direction X, the heat radiating plates 24 are located inside the outlines of the raised portions 311. This results in an increase in area of thermal contact between the cooling pipe 3 and the heat radiating plate 24 and avoids local concentration of stress on the insulator 11.

Figure 7:
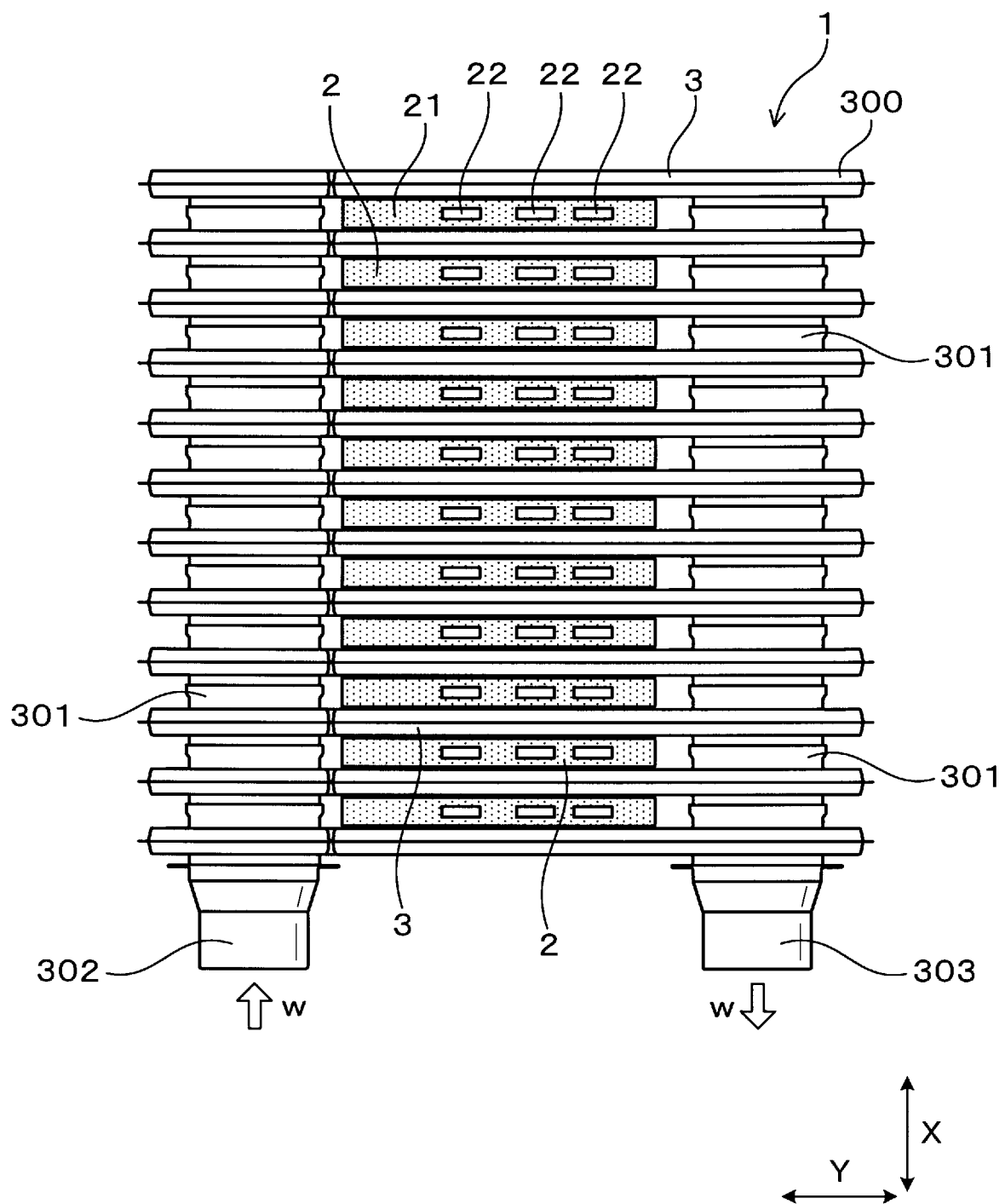
FIG. 7 is a plan view which illustrates a semiconductor module and a cooler in the first embodiment.

The semiconductor module 2 is further stacked, as clearly illustrated in FIG. 7, through the insulator 11 on the above assembly of the semiconductor 2 and the insulators 11. Specifically, the cooling pipes 3, the semiconductor modules 2, and the insulators 11 (not shown in FIG. 7) are alternately stacked into the form illustrated in FIG. 7. FIG. 7 omits the insulators 11 for the sake of simplicity of illustration.

The cooling pipes 3 which are disposed adjacent each other in the stacking direction X are, as clearly illustrated in FIGS. 3 and 7, joined together using the connecting pipes 301 at ends thereof spaced apart from each other in the lateral direction Y. Each of the connecting pipes 301 fluidically connects between the cooling medium flow paths 30 of the adjacent cooling pipes 3. The cooling pipes 3 are, as described above, stacked in the form of a cooling pipe assembly shown in FIG. 7. The cooling pipe assembly has ends opposed to each other in the stacking direction X. The cooling pipe 3 which is arranged at one of the ends of the cooling pipe assembly has the cooling medium inlet 302 and the cooling medium outlet 303.

The cooling medium flow path 30 of each of the cooling pipes 3, as clearly illustrated in FIG. 6, has the inlet 361 and the outlet 381 formed in ends of the cooling medium flow path 30 opposed to each other in the lateral direction Y. The inlet 361 communicates with the cooling medium supply path 36. The outlet 381 communicates with the cooling medium draining path 38. The connecting pipes 301 are connected to the inlet 361 and the outlet 381, respectively. The cooling medium inlet 302 and the cooling medium outlet 303 are respectively connected to the inlet 361 and the outlet 381 of the cooling pipe 3 arranged at one of the ends of the cooling pipe assembly.

The cooling pipes 3 are, as illustrated in FIG. 7, physically arranged parallel to each other and joined together in this way to form the cooler 300 in which each of the semiconductor modules 2 is disposed between respective adjacent two of the cooling pipes 3.

After entering the cooler 300 at the cooling medium inlet 302, the cooling medium w is, as illustrated in FIG. 6, delivered from the inlet 361 to the cooling medium flow path 30 of each of the cooling pipes 3. When entering each of the cooling pipes, the cooling medium w is first supplied to the cooling medium supply path 36 and then sent to the heat exchanger 37. The cooling medium w is distributed into a plurality of flows arrayed in the lateral direction Y which move along the inner fins 35 in the height-wise direction Z. The cooling medium w then emerges from the heat exchanger 37 into the cooling medium draining path 38. Specifically, after passing through the heat exchanger 37, the flows of the cooling medium w are collected in the cooling medium draining path 38 and then emitted from the cooling pipe 3 through the cooling medium draining path 38 and the outlet 381. In this way, the cooling medium w flows through the cooling pipes 3 to cool the semiconductor modules 2. The cooling medium w, as drained from the cooling pipes 3, is discharged, as illustrated in FIG. 7, from the cooler 300 through the cooling medium outlet 303.

The power terminals 22 of the semiconductor modules 2, as illustrated in FIGS. 1 and 2, protrude above the cooling pipes 3 in the height-wise direction Z and, as can be seen in FIG. 2, connect with the bus bars 13 disposed above the cooling pipes 3. The joint 130 between the power terminal 22 and the bus bar 13 is located farther away from the module body 21 than from the flow path extension forming portion 32 in the height-wise direction Z.

The distances d between the power terminals 22 and the flow path extension forming portions 32 which are arranged adjacent each other through the power terminals 22 in the stacking direction X are set equal to each other.

The control terminals 23 protrude below the cooling pipes 3 in the height-wise direction Z and connect with a control circuit board, not shown, mounted beneath the cooling pipes 3.

The semiconductor devices 20 are, as clearly illustrated in FIG. 3, disposed between the cooling pipes 3 arranged adjacent each other in the stacking direction X. Specifically, the semiconductor devices 20 are aligned in the lateral direction Y between the cooling pipes 3 and, as can be seen in FIGS. 3 and 4, installed in each of the semiconductor modules 2.

The electrical power conversion device 1 may be used as an inverter which performs power conversion between a dc power supply and a three-phase electrical rotating machine.

In this embodiment, the semiconductor module 2 has disposed therein four switching devices implemented by the semiconductor devices 20. The switching devices, as illustrated in FIG. 8, work as two upper arm switching devices $2u$ which are connected in parallel to each other and two lower arm switching devices $2d$ which are connected in series with the upper arm switching devices $2u$.

Figure 8:
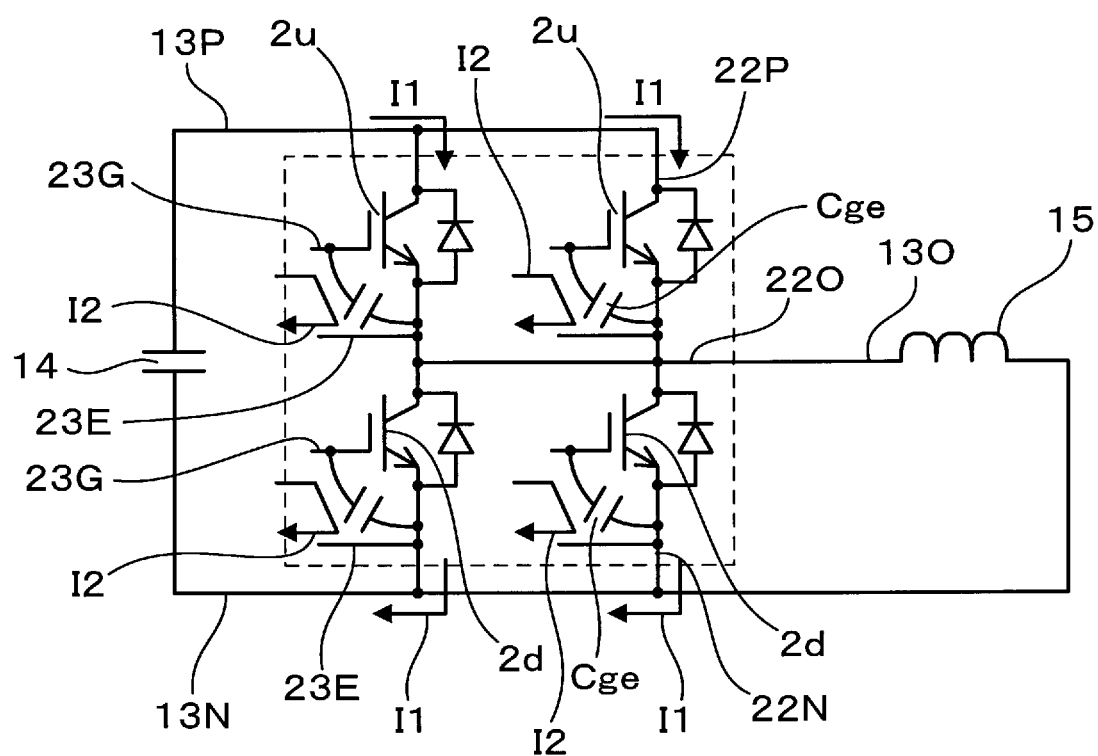
FIG. 8 is a circuit diagram which partially illustrates a circuit structure of an electrical power conversion device in the first embodiment.

FIG. 8 is a schematic circuit diagram which demonstrates the smoothing capacitor 14, the semiconductor module 2, and the coil 15 for each phase of the electrical rotating machine. The smoothing capacitor 14 is connected between the high-potential bus bar 13P and the low-potential bus bar 13N. The coil 15 is connected to the semiconductor module 2. The capacitance Cge denoted in FIG. 8 represents a parasitic capacitance of each of the switching devices 2.

The switching devices $2u$ and $2d$ of each of the semiconductor modules 2 are made of an IGBT (Insulated Gate Bipolar Transistor). Each of the upper arm switching devices $2u$ and the lower arm switching devices $2d$ has a flywheeling diode connected in inverse-parallel thereto. A joint between each of the upper arm switching devices $2u$ and one of the lower arm switching devices $2d$ is connected to one of electrodes of the electrical rotating machine. The switching devices $2u$ and $2d$ may alternatively be implemented by a MOSFET (i.e., metal-oxide-semiconductor field-effect transistor).

Each of the semiconductor modules 2 is, as illustrated in FIG. 4, equipped with three power terminals 22P, 22N, and 22O which will also be generally denoted by reference numeral 22. The power terminal 22P is, as shown in FIG. 8, electrically connected to collectors of the upper arm switching devices $2u$. The power terminal 22N is electrically connected to emitters of the lower arm switching devices $2d$. The power terminal 22O is electrically connected to the emitters of the upper arm switching devices $2u$ and the collectors of the lower arm switching devices $2d$. The power terminal 22P is electrically connected to the high-potential bus bar 13P leading to the positive terminal of the dc power supply. The power terminal 22N is electrically connected to the low-potential bus bar 13N leading to the negative terminal of the dc power supply. The power terminal 22O is electrically connected to the output bus bar 13O leading to the electrical rotating machine.

The semiconductor module 2 is, as illustrated in FIG. 4, equipped with the control terminals 23 for the upper arm switching devices 2u and the control terminals 23 for the lower arm switching devices 2d. Specifically, the control terminals 23 include control terminals 23G connected to the gates of the switching devices 2u and 2d and control terminals 23E connected to the emitters of the switching devices 2u and 2d.

The electrical power conversion device 1 works to selectively turn on or off the switching devices 2u and 2d to achieve power conversion. This causes a controlled current to be changed in a closed loop which is, as illustrated in FIG. 8, made up of the upper arm switching device 2u and the lower arm switching device 2d connected in series and the smoothing capacitor 14. It is, therefore, desirable to decrease the inductance in the closed loop.

Figure 9:
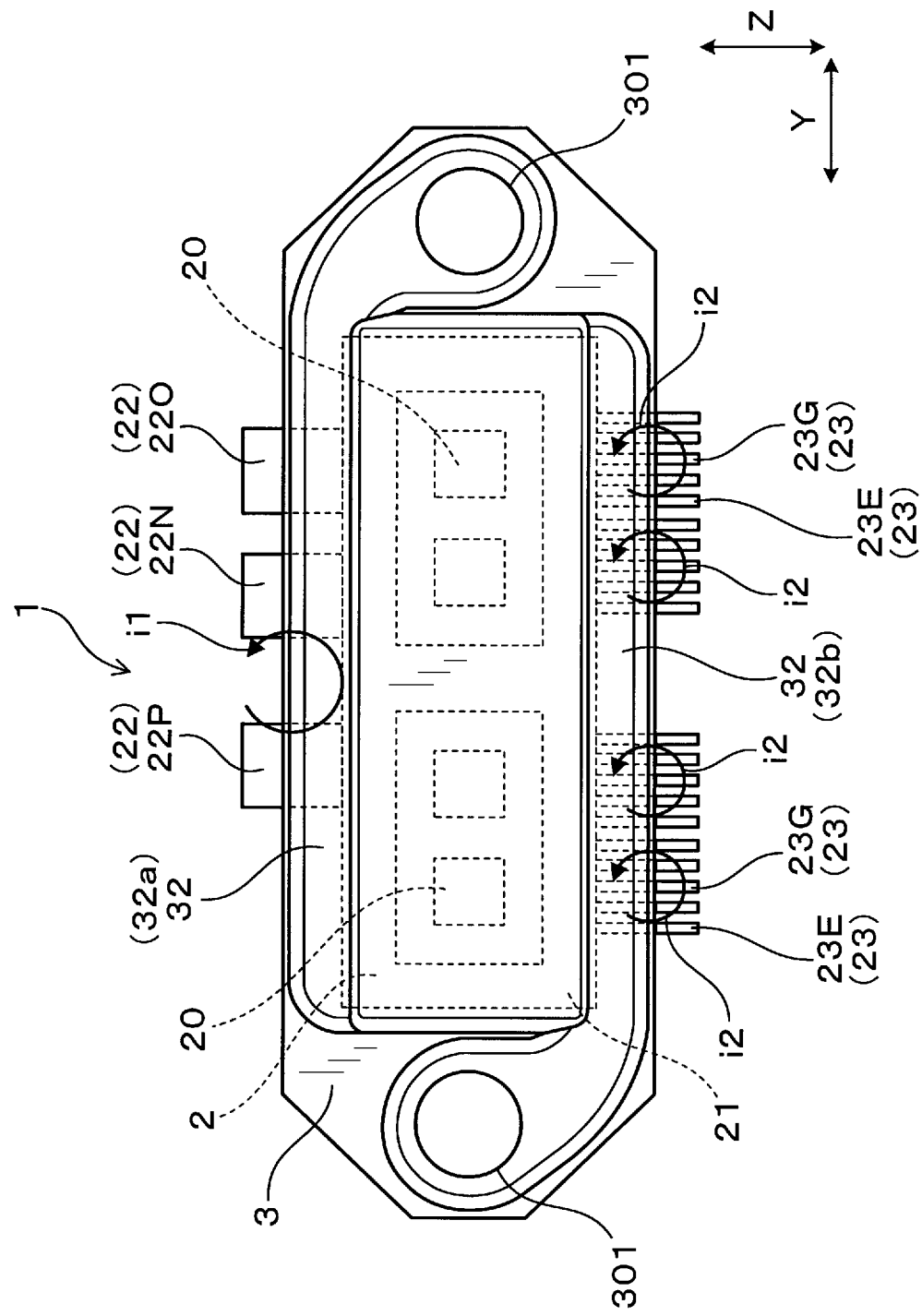
FIG. 9 is an explanatory view which demonstrates current loops created in a semiconductor module in the first embodiment.

Specifically, an alternating current component I1 of the controlled current varying in the closed loop, as can be seen in FIG. 8, flows in opposite directions in each of the power terminals 22P and each of the power terminals 22N. This forms, as illustrated in FIG. 9, a current loop i1 including the power terminal 22P and the power terminal 22N arranged adjacent each other.

The current loop i1 creates a magnetic flux in the stacking direction X. The flow path extension forming portion 32, as described above, faces the power terminal 22P and the power terminal 22N, thereby causing an eddy current to be developed in the flow path extension forming portion 32 to cancel the magnetic flux produced by the current loop i1, which results in a decrease in inductance of the power terminals 22.

Similarly, currents I2, as clearly illustrated in FIG. 8, flow from the gates to the emitters of the respective switching devices 2u and 2d through the control terminals 23. In other words, the current flows from the control terminal 23G into the semiconductor module 2 and then goes out of the control terminal 23E. This creates, as illustrated in FIG. 9, the current loops i2 through the control terminals 23. The flow path extension forming portion 32 are, as described above, arranged to face the control terminals 23, thereby causing an eddy current, as created in the flow path extension forming portion 32, to cancel magnetic fluxes, as developed by the current loops i2 in the control terminals 23, which results in a decrease in inductance of the power terminals 23.

Beneficial advantages, as offered by the above embodiment, will be described below.

The electrical power conversion device 1 is, as described above, designed to have the flow path extension forming portion 32 overlapping the power terminals 22 and the control terminals 23 in the stacking direction X. This, as described already, causes the flow path extension forming portion 32 to develop eddy currents when the current flows through the power terminals 22 and the control terminals 23. The eddy currents serve to cancel the magnetic fluxes arising from the current loops, thereby resulting in a decrease in inductance of the power terminals 22 and the control terminals 23 facing the flow path extension forming portion 32.

Each of the flow path extension forming portions 32 has the cooling medium flow path 30 formed therein. This enables the flow path extension forming portion 32 to be located closer to the power terminals 22 and the control terminals 23 in the stacking direction X. This results in a great reduction in inductance of the power terminals 22 and the control terminals 23. The arrangement of the flow path extension forming portions 32 close to the power terminals 22 and the control terminals 23 facilitates cooling of the power terminals 22 and the control terminals 23.

Each of the outer shell plates 31 constituting the cooling pipe 3 is designed to have a relatively large thickness. The flow path extension forming portion 32 made of portions of the outer shell plates 31, thus, have a relatively large thickness, thereby ensuring a desired mechanical strength of the flow path extension forming portion 32. This minimizes a risk of undesirable deformation of the flow path extension forming portion 32, which improves the productivity of the electrical power conversion device 1.

The cooling pipe 3 has the flow path extension forming portions 32 extending both in the opposite height-wise directions Z. The flow path extension forming portion 32a protruding upward is laid to overlap the power terminals 22 in the stacking direction X, while the flow path extension forming portion 32b protruding downward is laid to overlap the control terminals 23 in the stacking direction X. This results in decreases in inductance of both the power terminals 22 and the control terminals 23.

Each of the cooling pipes 3 is equipped with the heat exchanger 37, the cooling medium supply path 36, and the cooling medium draining path 38 which define the cooling medium flow path 30. The cooling medium supply path 36 and the cooling medium draining path 38 are formed by the flow path extension forming portion 32. The heat exchanger 37 is, as illustrated in FIG. 6, designed to have the cooling medium w flowing therethrough from the cooling medium supply path 36 to the cooling medium draining path 38 in the height-wise direction Z. This minimizes a loss of pressure of the cooling medium w flowing in the cooling medium flow path 30 and achieves supply of the cooling medium w to the heat exchanger 37 in the form of a plurality of flows arrayed in the lateral direction Y.

The semiconductor devices 20 are aligned in the lateral direction Y between each two cooling pipes 3 adjacent each other in the stacking direction X. A variation in cooling of the semiconductor devices 20 is, therefore, minimized by supplying flows into which the cooling medium w is distributed and which are separate from each other in the lateral direction Y to the heat exchanger 37. In other words, the electrical power conversion device 1 is designed not to have the semiconductor devices 20 separately arranged upstream and downstream of the heat exchanger 37.

The joint 130 between the power terminal 22 and the bus bar 13 is, as described above, located farther away from the module body 21 than from the flow path extension forming portion 32 in the height-wise direction Z, thereby facilitating the ease with which the power terminal 22 and the bus bar 13 is electrically connected together.

The distances d between the power terminals 22 and the flow path extension forming portions 32 which are arranged adjacent each other through the power terminals 22 in the stacking direction X are, as described above, equal to each other. This enhances the efficiency in cooing the power terminals 22 from opposite directions in the stacking direction X.

As apparent from the above discussion, the electrical power conversion device 1 is designed to decrease the inductance of the power terminals 22 and/or the control terminals 23, improve the productivity thereof, and enable the size thereof to be reduced.

Second Embodiment

Figure 10:
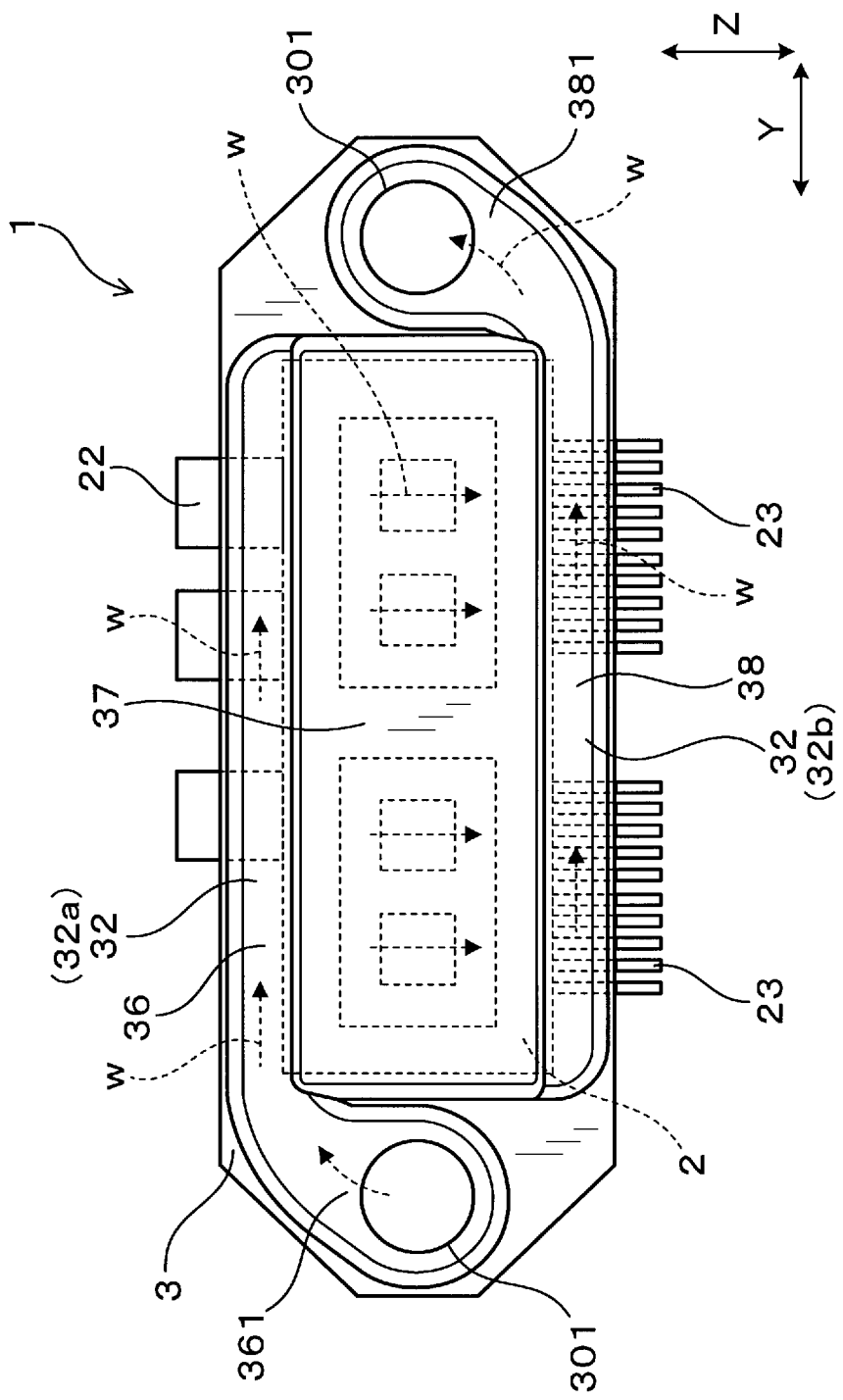
FIG. 10 is a front view which illustrates a semiconductor module and a cooling pipe according to the second embodiment.

FIG. 10 illustrates the electrical power conversion device 1 according to the second embodiment which is designed to have the cooling medium supply path 36 overlapping the power terminals 22 in the stacking direction X and also have the cooling medium draining path 38 overlapping the control terminals 23 in the stacking direction X.

Other arrangements are identical with those in the first embodiment, and explanation thereof in detail will be omitted here. In the second and following embodiments, the same reference numbers, as employed in the preceding embodiment, refer to the same parts unless otherwise specified.

In operation, after entering each of the cooling pipes 3, the cooling medium w is delivered into the cooling medium supply path 36 in the flow path extension forming portion 32 facing the power terminals 22 before it exchanges the thermal energy with the module body 21 through the heat exchanger 37. This causes the lower-temperature cooling medium w to flow in the flow path extension forming portion 32 facing the power terminals 22, thereby enhancing the efficiency in cooling the power terminals 22. Usually, the power terminals 22 become higher in temperature than the control terminals 23 and thus are required to be cooled. The structure of the electrical power conversion device 1 of this embodiment is, therefore, useful in cooling the power terminals 22 more than the control terminals 23, thereby ensuring the stability in cooling the whole of the semiconductor modules 2.

The electrical power conversion device 1 of the second embodiment also offers substantially the same beneficial advantages as in the first embodiment.

Third Embodiment

Figure 11:
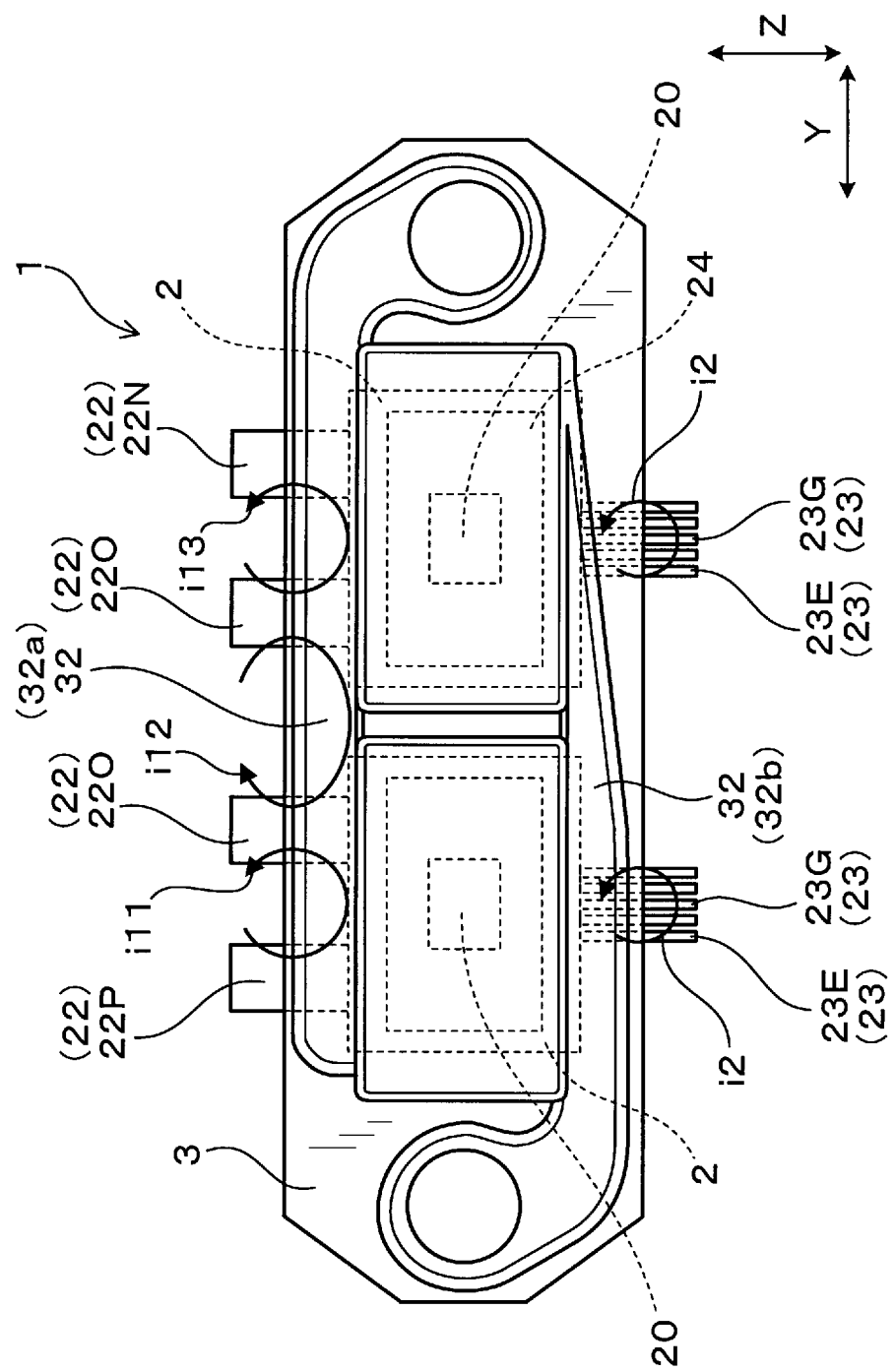
FIG. 11 is a front view which illustrates a semiconductor module and a cooling pipe according to the third embodiment.

FIG. 11 illustrates the electrical power conversion device 1 according to the third embodiment which is designed to have a plurality of semiconductor modules 2 aligned in the lateral direction Y between each two of the cooling pipes 3 adjacent in the stacking direction X.

The electrical power conversion device 1 has the semiconductor modules 2 each of which is equipped with a single switching device installed therein. Each two of the semiconductor modules 2 are arranged adjacent each other in the lateral direction Y and retained or firmly held by the two cooling pipes 3 opposed to each other in the stacking direction X.

Figure 12:
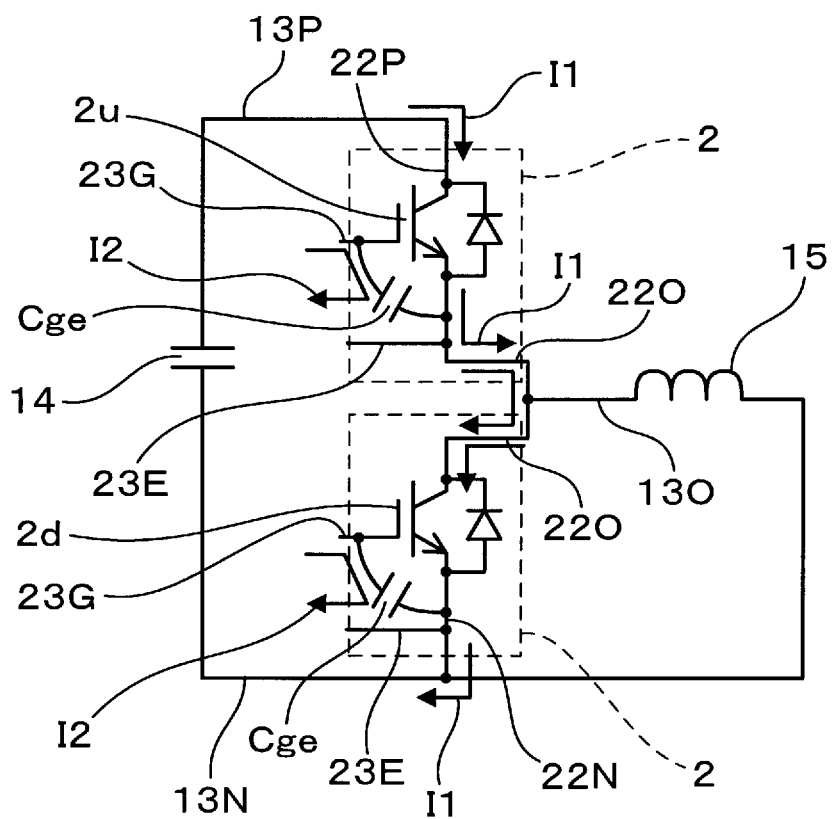
FIG. 12 is a circuit diagram which partially illustrates a circuit structure of an electrical power conversion device in the third embodiment.

Two of the semiconductor modules 2 which are arranged adjacent each other in the lateral direction Y respectively have, as illustrated in FIG. 12, the upper arm switching device 2u and the lower arm switching device 2d connected in series. The adjacent semiconductor modules 2 are, as illustrated in FIG. 11, arranged to have the power terminals 22O which are connected to the output bus bar 13O and disposed close to each other in the lateral direction Y. Each of the power terminal 22P leading to the high-potential bus bar 13P and the power terminal 22N leading to the low-potential bus bar 13N is located outside one of the power terminals 22O. In other words, the power terminals 22O, 22P, and 22N are aligned in the lateral direction Y.

Consider, like in the first embodiment, an alternating current component I1 of a controlled current varying in a closed loop, as illustrated in FIG. 12, made up of the upper arm switching device 2u, the lower arm switching device 2d connected in series with the upper arm switching device 2u, and the smoothing capacitor 14. The alternating current component I1 flows out of the power terminal 22P of the upper arm semiconductor module 2 and then enters the power terminal 22O of the upper arm semiconductor module 2.

Subsequently, the alternating current component I1 flows out of the power terminal 22O of the lower arm semiconductor module 2 and then enters the power terminal 22N of the lower arm semiconductor module 2. Therefore, the alternating current component I1 flows in mutual opposite directions in the power terminal 22P and the power terminal 22O of the upper arm semiconductor module 2. Similarly, the alternating current component I1 flows in mutual opposite directions in the power terminal 22O of the upper arm semiconductor module 2 and the power terminal 22O of the lower arm semiconductor module 2. Further, the alternating current component I1 flows in mutual opposite directions in the power terminal 22O and the power terminal 22N of the lower arm semiconductor module 2. This, as clearly illustrated in FIG. 11, creates current loops i11, i12, and i13 each of which includes the adjacent power terminals 22.

The flow path extension forming portion 32 is arranged to overlap all the four power terminals 22 in the stacking direction X. The eddy current is, thus, created in the flow path extension forming portion 32 to cancel magnetic fluxes developed by the current loops i11, i12, and i13, thereby decreasing the inductance of the power terminals 22.

The electrical power conversion device 1 of the third embodiment, like in the first embodiment, has the ability to reduce the inductance of the power terminals 22 and/or the control terminals 23 and also offers substantially the same beneficial advantages as in the first embodiment.

The electrical power conversion device 1 of this embodiment also has the heat exchanger 37, as can be seen in FIG. 13, divided into two sections which are arranged in the lateral direction Y through which the cooling medium flow path 30 of the cooling pipe 3 passes. Specifically, the heat exchanger 37 has the dividing member 371 disposed in the middle thereof in the lateral direction Y. The dividing member 371 is formed by extending portions of the outer shell plates 31 toward the intermediate pate 34. The dividing member 371 is also shaped to extend in the height-wise direction Z. More specifically, the dividing member 371 extends over the whole of the heat exchanger 37 in the height-wise direction Z.

The inner fins 35 are disposed in each of the two sections into which the heat exchanger 37 is broken by the dividing member 371. The cooling medium supply path 36 includes the tapered portion 362 whose dimension in the height-wise direction Z gradually decreases with an increase in distance to the inlet 361 in the lateral direction Y. The tapered portion 362 is shaped to extend in the lateral direction Y from a portion of the cooling medium supply path 36 located closer to the inlet 361 than the dividing member 371 is to an end of the cooling medium supply path 36 closer to the outlet 381.

The tapered portion 362 of the cooling medium supply path 36 serves to facilitate the supply of the cooling medium w from the cooling medium supply path 36 to the heat exchanger 37, thereby minimizing a variation in distribution of the cooling medium w in the lateral direction Y.

The cooling medium draining path 38 is shaped to have the end 382 closer to the inlet 361. The end 382 is located farther away from the inlet 361 than the end of the heat exchanger 37 is in the lateral direction Y.

Other arrangements are identical with those in the first embodiment, and explanation thereof in detail will be omitted here.

Fourth Embodiment

FIG. 14 illustrates the electrical power conversion device 1 according to the fourth embodiment which is designed to have the inner fins 35 each of which is of a corrugated shape, as viewed in the stacking direction X. The cooling medium flow path 30 between each of the inner fins 35 and the outer shell plate 31 and the cooling medium flow path 30 between each of the inner fins 35 ad the intermediate plate 34 in the heat exchanger 37 are, therefore, curved in the corrugated shape. In this embodiment, the cooling medium flow path 30 is curved in zigzags.

Other arrangements are identical with those in the third embodiment, and explanation thereof in detail will be omitted here.

The cooling medium flow path 30 in this embodiment is, as described above, designed to have a portion curved in a corrugated shape in the heat exchanger 37, thus resulting in an increase in area of the inner fins 35 in contact with the inner fins 35, which enhances the ability of the heat exchanger 37 to cool the semiconductor module 2.

The electrical power conversion device 1 of the fourth embodiment also has substantially the same other beneficial advantages as in the third embodiment.

Fifth Embodiment

FIG. 15 illustrates the electrical power conversion device 1 according to the fifth embodiment which has the inner fins 35 designed in a pin shape. Specifically, the inner fins 35 are formed by a plurality of pins or protrusions 351 extending from the outer shell plate 31 or the intermediate plate 34 in the stacking direction X.

Other arrangements are identical with those in the third embodiment, and explanation thereof in detail will be omitted here.

In the heat exchanger 37, the cooling medium flows from the cooling medium supply path 36 to the cooling medium draining path 38 in contact with the pin-shaped protrusions 351, thereby enhancing the efficiency in cooling the semiconductor module 2.

The electrical power conversion device 1 of the fifth embodiment also offers substantially the same beneficial advantages as in the first embodiment.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

In the above embodiments, the flow path extension forming portions 32 are arranged to overlap both the power terminals 22 and the control terminals 23 in the stacking direction X, but however, they may alternatively be designed to overlap either of the power terminals 22 or the control terminals 23 in the stacking direction X. It is, however, desirable that the flow path extension forming portions 32 overlap the power terminals 22 in the stacking direction X in order to enhance the efficiency in decreasing the inductance of the power terminals 22. This also enhances cooling of the power terminals 22.

Each of the cooling pipes 3 may be designed not to have the intermediate plate 34.

What is claimed is:

1. An electrical power conversion apparatus comprising:
a semiconductor module which includes a module body in which a semiconductor device is installed, a plurality of power terminals extending from the module body, and a plurality of control terminals extending from the module body, the module body having major surfaces; and
a first and a second cooling pipe which are stacked on each other through the semiconductor module and hold the major surfaces of the module body therebetween,
wherein each of the first and second cooling pipes has electrical conductivity and is equipped with a cooling medium flow path in which a cooling medium flows,
wherein the power terminals extend from the module body in a first height-wise direction that is one of height-wise directions perpendicular to a stacking direction in which the first and second cooling pipes and the semiconductor module are stacked,
wherein the control terminals extend from the module body in a second height-wise direction that is one of the height-wise directions,
wherein each of the first and second cooling pipes includes a flow path extension forming portion which extends therefrom over the module body in at least one of the height-wise directions and in which a portion of the cooling medium flow path is formed, and
wherein the flow path extension forming portions overlap at least either of the power terminals or the control terminals in the stacking direction,
wherein the flow path extension forming portions are spaced apart from the at least either of the power terminals or the control terminals in the stacking direction,
and
wherein a cooling medium supply path formed in the flow path extension forming portions includes a tapered portion that has a dimension in the height-wise directions gradually decreasing with an increase in distance to an inlet of the cooling medium flow path in a lateral direction perpendicular to the height-wise directions and to the stacking direction, the tapered portion shaped to extend in the lateral direction from a portion of the cooling medium flow path located closer to the inlet than a dividing member is to an end of the cooling medium supply path closer to an outlet of the cooling medium flow path, the dividing member disposed in a middle of a heat exchanger designed to have the cooling medium flowing from the cooling medium supply path to a cooling medium draining path.

2. An electrical power conversion apparatus as set forth in claim 1, wherein each of the power terminals and each of the control terminals of the semiconductor module extend away from each other from the module body in the height-wise directions, wherein each of the flow path extension forming portions is laid to overlap at least the power terminals in the stacking direction.

3. An electrical power conversion apparatus as set forth in claim 2, wherein the flow path extension forming portions include a first flow path extension forming portion and a second flow path extension forming portion which protrude away from each other in the height-wise directions, the first flow path extension portion being laid to overlap the power terminals in the stacking direction, the second flow path extension portion being laid to overlap the control terminals in the stacking direction.

4. An electrical power conversion apparatus as set forth in claim 3, wherein each of the first and second cooling pipes is equipped with the heat exchanger which works to exchange thermal energy between the cooling medium and the module body, the cooling medium supply path, and a cooling medium draining path, the cooling medium supply path and the cooling medium draining path being disposed on sides of the heat exchanger which are opposed to each other in the height-wise direction.

5. An electrical power conversion apparatus as set forth in claim 4, wherein the cooling medium supply path overlap the power terminals in the stacking direction, and wherein the cooling medium draining path overlaps the control terminals in the stacking direction.

6. An electrical power conversion apparatus as set forth in claim 4, wherein a plurality of semiconductor devices are disposed between the first and second cooling pipes arranged adjacent each other in the stacking direction, the semiconductor devices being aligned with each other in a lateral direction perpendicular to the stacking and height-wise directions.

7. An electrical power conversion apparatus as set forth in claim 6, wherein a plurality of semiconductor modules are arranged in the lateral direction between the first and second cooling pipes adjacent each other in the stacking direction.

8. An electrical power conversion apparatus as set forth in claim 2, wherein a joint between each of the power terminals and a bus bar connected to the power terminal is located farther away from the module body than from the flow path extension forming portion in the height-wise direction.

9. An electrical power conversion apparatus as set forth in claim 2, wherein distances between the power terminals and the flow path extension forming portions which are arranged adjacent each other through the power terminals in the stacking direction are equal to each other.

\* \* \* \* \*